United States Patent
Komori et al.

(10) Patent No.: US 8,927,855 B2
(45) Date of Patent: Jan. 6, 2015

(54) SOLAR CELL AND METHOD FOR FABRICATING THE SAME

(71) Applicant: Panasonic Corporation, Osaka (JP)

(72) Inventors: Tomoyuki Komori, Osaka (JP); Eiji Fujii, Osaka (JP); Akihiro Itoh, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/056,266

(22) Filed: Oct. 17, 2013

(65) Prior Publication Data
US 2014/0041723 A1 Feb. 13, 2014

Related U.S. Application Data

(63) Continuation of application No. PCT/JP2012/003323, filed on May 22, 2012.

(30) Foreign Application Priority Data

Jun. 14, 2011 (JP) .................... 2011-131954

(51) Int. Cl.
*H01L 31/0224* (2006.01)
*H01L 31/18* (2006.01)

(52) U.S. Cl.
CPC .... *H01L 31/022483* (2013.01); *H01L 31/1884* (2013.01); *Y02E 10/50* (2013.01)
USPC .............. 136/256; 136/252; 438/72

(58) Field of Classification Search
USPC ..................... 136/256, 252; 438/72
See application file for complete search history.

(56) References Cited

U.S. PATENT DOCUMENTS

| | | | | |
|---|---|---|---|---|
| 7,291,782 B2* | 11/2007 | Sager et al. | ........... | 136/250 |
| 7,462,774 B2* | 12/2008 | Roscheisen et al. | ........... | 136/256 |
| 7,511,217 B1* | 3/2009 | Roscheisen et al. | ........... | 136/263 |

(Continued)

FOREIGN PATENT DOCUMENTS

| | | |
|---|---|---|
| JP | 63-226971 A | 9/1988 |
| JP | 63-234566 A | 9/1988 |

OTHER PUBLICATIONS

Khan, Y., et al.: ZnO Nanorods for Simultaneous Light Trapping and Transparent Electrode Application in Solar Cells, IEEE, 2011, pp. 619-620.

(Continued)

*Primary Examiner* — Golam Mowla
(74) *Attorney, Agent, or Firm* — McDermott Will & Emery LLP

(57) ABSTRACT

A solar cell comprises an n-type semiconductor layer, a p-type semiconductor layer, a p-side electrode layer, an n-side electrode; and a ZnO transparent electrode layer.

The n-side electrode layer consists of $Ag_xAu_{1-x}$, and x represents a value of not less than 0.1 and not more than 0.5. The ZnO transparent electrode layer is composed of a plurality of ZnO columnar particles and each ZnO columnar particle has a longitudinal direction substantially parallel to a normal line of the ZnO transparent electrode layer. The cross-sectional area of each ZnO columnar particles that appears by cutting the ZnO columnar particles perpendicularly to the longitudinal direction increases from the upper surface of the n-side electrode layer to the upper surface of the ZnO transparent electrode layer.

8 Claims, 8 Drawing Sheets

(56) References Cited

U.S. PATENT DOCUMENTS

2005/0121068 A1* 6/2005 Sager et al. ............... 136/252
2008/0259262 A1 10/2008 Jones et al.
2009/0129004 A1 5/2009 Gruner
2009/0321364 A1 12/2009 Spaid et al.
2012/0033367 A1 2/2012 Jones et al.

OTHER PUBLICATIONS

International Search Report issued in PCT/JP2012/003323, dated Apr. 4, 2013.

* cited by examiner

SOLAR CELL AND METHOD FOR FABRICATING THE SAME

This is a continuation of International Application No. PCT/JP2012/003323, with an international filing date of May 22, 2012, which claims priority of Japanese Patent Application No. 2011-131954 filed on Jun. 14, 2011, the contents of which are hereby incorporated by reference.

TECHNICAL FIELD

The present invention relates to a solar cell having high conversion efficiency and a method for fabricating the same.

BACKGROUND ART

FIG. 5 shows a solar cell disclosed in Patent Literature 1. This solar cell comprises a reverse electrode layer 4, an n-type GaAs layer 1, a p-type GaAs layer 2, and an obverse electrode 3. An example of a material of the obverse electrode 3 is gold, silver, or platinum. A window layer 5 and an anti-reflection film 6 are provided around the obverse electrode 3.

The irradiation of sunlight to the obverse electrode 3 reduces efficiency of the solar cell, because the light arrived at the obverse electrode 3 is reflected on the obverse electrode 3 and fails to be led to the p-type GaAs layer 2.

In order to solve this problem, this solar cell comprises a cover glass 7 having a convex part 7a. In the cross-sectional view, the obverse electrode 3 is located under the convex part 7a. The convex part 7a allows the sunlight which travels toward the obverse electrode 3 to be refracted and to be led through the anti-reflection film 6 and the window layer 5 to the p-type GaAs layer 2.

CITATION LIST

Patent Literature

PTL 1: Japanese Laid-Open Patent Publication No. S63-226971

SUMMARY OF INVENTION

Technical Problem

The purpose of the present invention is to provide a novel solar cell having high conversion efficiency and a method for fabricating the same.

Solution to Problem

The present invention solves the above problem by the solar cell comprising:
an n-type semiconductor layer;
a p-type semiconductor layer;
a p-side electrode layer;
an n-side electrode; and
a ZnO transparent electrode layer; wherein
the n-type semiconductor layer is in contact with the p-type semiconductor layer;
the p-type semiconductor layer is interposed between the p-side electrode layer and the n-type semiconductor layer;
the n-type semiconductor layer is interposed between the n-side electrode layer and the p-type semiconductor layer;
the n-side electrode layer covers a part of the upper surface of the n-type semiconductor layer;
the n-side electrode layer formed of $Ag_xAu_{1-x}$;
x represents a value of not less than 0.1 and not more than 0.5;
the ZnO transparent electrode layer is formed on the upper surface of the n-side electrode layer;
the ZnO transparent electrode layer is composed of a plurality of ZnO columnar particles,
each ZnO columnar particle has a longitudinal direction substantially parallel to a normal line of the ZnO transparent electrode layer; and
the cross-sectional area of each ZnO columnar particles that appears by cutting the ZnO columnar particles perpendicularly to the longitudinal direction increases from the upper surface of the n-side electrode layer to the upper surface of the ZnO transparent electrode layer.

Advantageous Effects of Invention

The present invention provides a new solar cell having high conversion efficiency and a method for fabricating the same.

DESCRIPTION OF EMBODIMENTS

The embodiment of the present disclosure is described below with reference to the drawings.

Embodiment

Figure 1A:
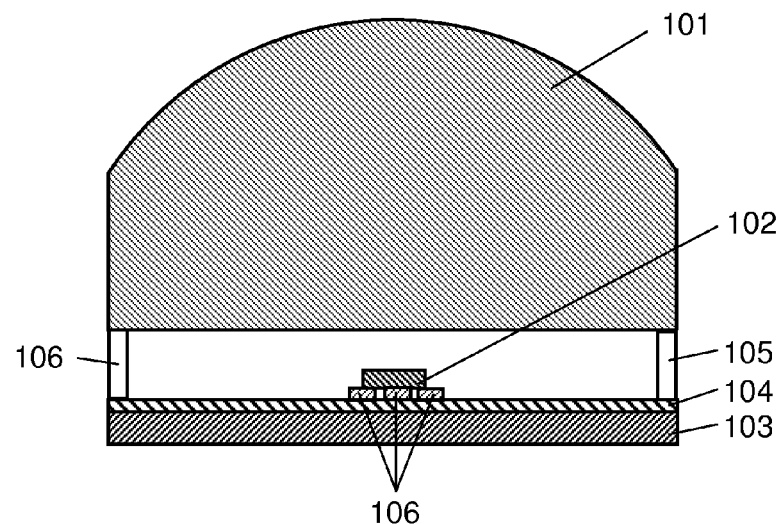
FIG. 1A shows a cross-sectional view of the solar cell device according to the embodiment.

FIG. 1A shows a cross-sectional view of the solar cell device according to the embodiment.

The solar cell device comprises a condenser lens 101, a solar cell 102, a cooling plate 103, an insulating layer 104, a spacer 105, and an electric wiring part 106. The insulating layer 104, the electric wiring part 106, and the solar cell 102 are stacked in this order on the surface of the cooling plate 103. The spacer 105 is interposed between the condenser lens 101 and the cooling plate 103.

It is preferable that the cooling plate 103 is an aluminum plate or a copper plate. A suitable material of the insulating layer 104 is epoxy resin.

The spacer 105 has a mechanical intensity so that the interval formed between the solar cell 102 and the condenser lens 101 is maintained at a predetermined distance. Furthermore, it is preferable that the spacer 105 serves as an adhesive layer between the condenser lens 101 and the cooling plate 103. An example of a suitable material of the spacer 105 is glass or epoxy resin.

A suitable material of the electric wiring part 106 is copper or nickel.

Figure 1B:
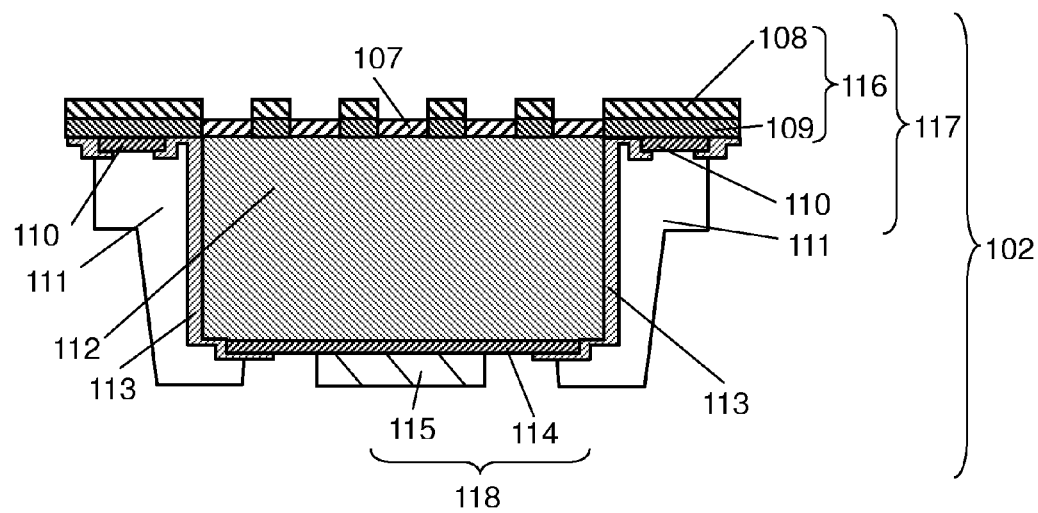
FIG. 1B shows a cross-sectional view of the solar cell according to the embodiment.

FIG. 1B shows a cross-sectional view of the solar cell 102 according to the embodiment.

The solar cell 102 comprises an obverse electrode 117, a power generation layer 112, an insulating layer 113, and a reverse electrode 118.

The obverse electrode 117 is composed of a grid electrode 116, an n-side bus electrode layer 110, and an n-side connecting part 111. The grid electrode 116 is formed of a laminate composed of a ZnO transparent electrode layer 108, and an n-side electrode layer 109. The reverse electrode 118 is composed of a p-side bus electrode layer 114 and a p-side connecting part 115.

The obverse electrode 117 and the reverse electrode 118 are connected electrically and independently to the electric wiring part 106 (not shown in FIG. 1B). In more detail, the bottom end of the n-side connecting part 111 and the bottom surface of the p-side connecting part 115 are connected electrically and independently to the electric wiring part 106 (not shown in FIG. 1B).

The solar cell 112 comprises an n-type semiconductor layer and a p-type semiconductor layer.

The n-side electrode layer 109 covers a part of the upper surface of the n-type semiconductor layer. The other part of the upper surface of the n-type semiconductor layer is covered by an anti-reflection film 107. A suitable material of the anti-reflection film 107 is titanium oxide or magnesium fluoride.

The n-side electrode layer 109 consists of $Ag_xAu_{1-x}$. The character "x" represents a value of not less than 0.1 and not more than 0.5.

Figure 1C:
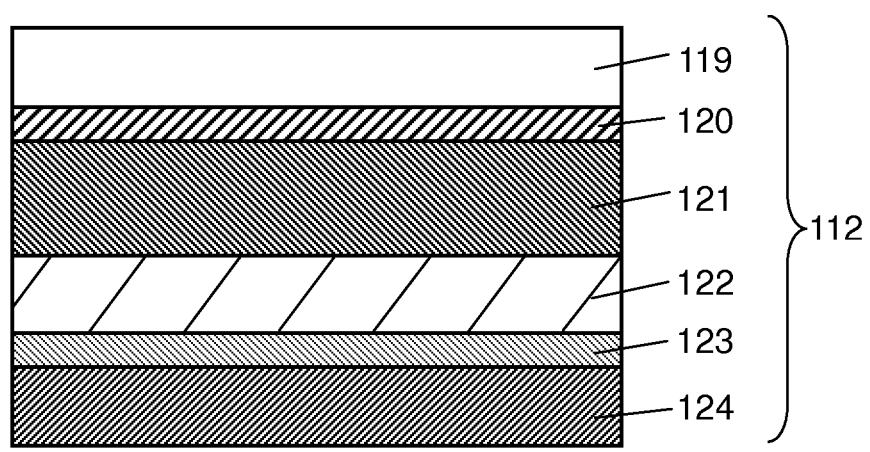
FIG. 1C shows a cross-sectional view of a power generation layer 112 comprised in the solar cell according to the embodiment.

FIG. 1C shows a cross-sectional view of the power generation layer 112.

The power generation layer 112 comprises an n-side contact layer 119, an n-side window layer 120, an n-type emitter layer 121, a p-type base layer 122, a p-side window layer 123, and a p-side contact layer 124. These layers are stacked in this order. The n-type semiconductor layer comprises the n-side contact layer 119, the n-side window layer 120, and the n-type emitter layer 121. The p-type semiconductor layer comprises the p-type base layer 122, the p-side window layer 123, and the p-side contact layer 124.

A pn-junction is formed in the interface between the n-type semiconductor layer and the p-type semiconductor layer.

The sunlight which has arrived at the condenser lens 101 passes through the ZnO transparent electrode layer 108, the anti-reflection film 107, the n-side electrode layer 109, the n-side contact layer 119, and the n-side window layer 120 in this order. Subsequently, the sunlight is photoelectrically converted in the n-type emitter layer 121 and the p-type base layer 122. This photoelectrical conversion generates electric power between the obverse electrode 117 and the reverse electrode 118.

The ZnO transparent electrode layer 108 is formed of a plurality of ZnO columnar particles.

The ZnO columnar particles are formed by growing by a chemical bath deposition method using a silver atom contained in the n-side electrode layer 109 as a core.

Each ZnO columnar particle has a longitudinal direction substantially parallel to the normal line of the ZnO transparent electrode layer 108.

The cross-sectional area of the ZnO columnar particle which appears by cutting the ZnO columnar particle perpendicularly to the longitudinal direction thereof increases from the upper surface of the n-side electrode layer 109 toward the upper surface of the ZnO transparent electrode layer 108.

It is desirable that a ratio of the scattering light obtained with ZnO transparent electrode layer 108/the incident light is not less than 20% and not more than 85%. This is because the adhesion of the ZnO transparent electrode layer 108 to the n-side electrode layer 109 is improved and because the high conversion efficiency is obtained without increasing the direct current resistance of the grid electrode 116.

In the ZnO transparent electrode layer 108, R1 is defined as the diameter at the bottom end of the ZnO columnar particle located in the bottom surface of the ZnO transparent electrode layer 108. The bottom end of the ZnO columnar particle is in contact with the n-side electrode layer 109. R2 is defined as the diameter at the upper end of the ZnO columnar particle located at the outermost of the ZnO transparent electrode layer 108. The cross-section of the ZnO transparent electrode layer 108 is observed using an electron microscope to measure the diameter of the ZnO columnar particle. In this way, these R1 and R2 are calculated.

The cross-sectional area S1 and the cross-sectional area S2 are calculated from the obtained R1 and R2. The cross-sectional area S1 is the cross-sectional area at the bottom end of the ZnO columnar particle located at the bottom surface of the ZnO transparent electrode layer 108. The cross-sectional area S2 is the cross-sectional area at the upper end of the ZnO columnar particle located at the outermost of the ZnO transparent electrode layer 108.

Since the preferable R1/R2 is not less than 1.2 and not more than 1.5, it is desirable that S1/S2 is not less than 1.21 and no more than 2.25.

The obverse surface of the condenser lens 101 is irradiated with the sunlight. The sunlight is focused on the n-side window layer 120. It is preferable that the condenser lens 101 has a diameter of not less than 2.0 mm and not more than 10 mm, a thickness of not less than 1 mm and not more than 5 mm, and a transmittance of not less than 1.1 and not more than 2.0. It is preferable that the material of the condenser lens 101 is glass or resin having high transmittance.

The n-side contact layer 119 forms an ohmic contact between the n-side window layer 120 and the n-side electrode layer 109. It is preferable that the material of the n-side contact layer 119 is n-type GaAs.

The n-side window layer 120 is formed of n-type semiconductor which has a lattice constant close to that of GaAs and has a greater bandgap than GaAs. An example of the material of the n-side window layer 120 is n-type InGaP, n-type InAlP, or n-type InAlGaP.

The n-type emitter layer 121 is formed of a group III-group V compound semiconductor forming the pn-junction together with the p-type base layer 122. An example of the material of the n-type emitter layer 121 is n-type InGaAs, n-type GaAs, or n-type InGaP.

The p-type base layer 122 is formed of a group III-group V compound semiconductor forming the pn-junction together with the n-type emitter layer 121. An example of the material of the p-type base layer 122 is p-type InGaAs, p-type GaAs, or p-type InGaP.

The p-side window layer 123 is formed of p-type semiconductor which has a lattice constant close to that of GaAs and has a greater bandgap than GaAs. An example of the material of the p-side window layer 123 is p-type InGaP, p-type InAlGaP, or p-type InAlP.

The p-side contact layer 124 forms an ohmic contact between the p-side window layer 123 and the p-side bus electrode layer 114. An example of the material of the p-side contact layer 124 is p-type GaAs.

An insulating layer 113 is formed in the peripheral surface of the power generation layer 112. An example of a suitable material of the insulating layer 113 is non-doped InGaP, silicon dioxide, or silicon nitride.

A method for fabricating the solar cell according to the embodiment is described below with reference to FIG. 2A to FIG. 2H.

Figure 2A:
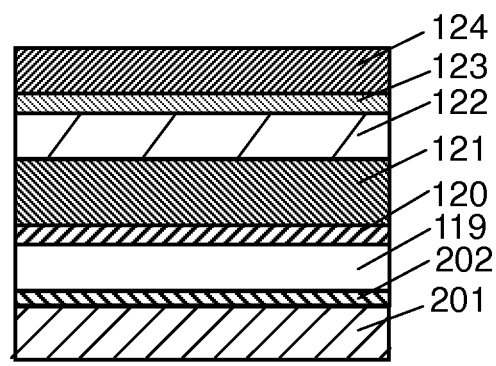
FIG. 2A shows a cross-sectional view of the fabrication method of the solar cell according to the embodiment.

First, as shown in FIG. 2A, a non-doped GaAs substrate 201 is prepared. A sacrifice layer 202, an n-side contact layer 119, an n-side window layer 120, an n-type emitter layer 121, a p-type base layer 122, a p-side window layer 123, and a p-side contact layer 124 are grown in this order on the surface of this GaAs substrate 201 by a conventional semiconductor growth method such as a molecular beam epitaxy method or a metal organic chemical vapor deposition method (hereinafter, referred to as an "MOCVD").

The sacrifice layer 202 has a lattice constant close to that of the GaAs. An example of a suitable material of the sacrifice layer 202 is aluminum arsenic (AlAs) or InGaP.

Figure 2B:
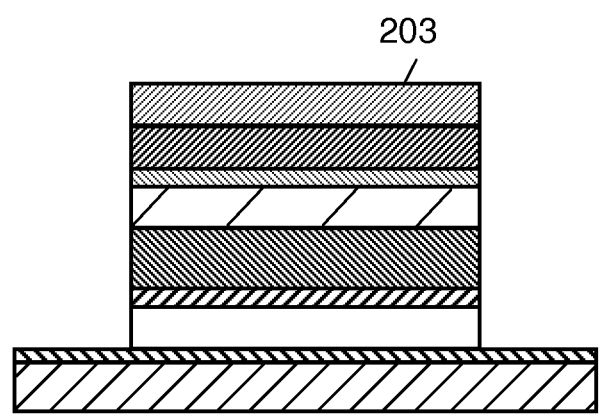
FIG. 2B shows a cross-sectional view of the fabrication method of the solar cell according to the embodiment subsequent to FIG. 2A.

Then, as shown in FIG. 2B, a first mask 203 is formed on the p-side contact layer 124. The p-side contact layer 124, the p-side window layer 123, the p-type base layer 122, the n-type emitter layer 121, the n-side window layer 120, and the n-side contact layer 119 are etched in this order using the first mask 203.

The first mask 203 may be formed by photolithography. Dry etching and wet etching may be used to etch the p-side contact layer 124, the p-side window layer 123, the p-type base layer 122, the n-type emitter layer 121, the n-side window layer 120, and the n-side contact layer 119. When the p-type base layer 122 is formed of p-type GaAs and the n-type emitter layer 121 is formed of n-type GaAs, an example of the dry etching is plasma etching using the mixed gas of $BCl_3$ and $SF_6$. For wet etching, a mixture of phosphoric acid and hydrogen peroxide water may be used.

Figure 2C:
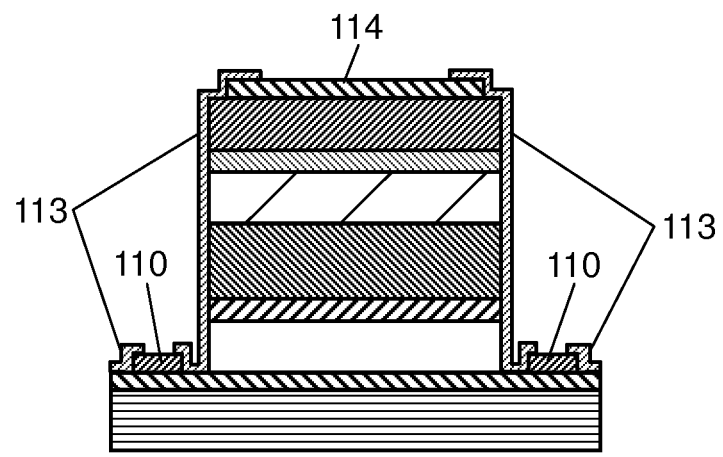
FIG. 2C shows a cross-sectional view of the fabrication method of the solar cell according to the embodiment subsequent to FIG. 2B.

As shown in FIG. 2C, the first mask 203 is removed, and the n-side bus electrode layer 110, the p-side bus electrode layer 114, and the insulating layer 113 are formed.

The first mask 203 can be removed by immersing the GaAs substrate 201 in a detachment liquid.

The insulating layer 113 is formed uniformly on the side surface of the power generation layer 112, on the upper surface of the power generation layer 112, and on the upper surface of the sacrifice layer 202. It is preferable that the insulating layer 113 is formed by a chemical vapor growth method.

Then, a resist film (not shown) is formed by photolithography. This resist film has openings on which the n-side bus electrode layer 110 and the p-side bus electrode layer 114 are exposed. Then, a part of the insulating layer 113 is removed by a dry etching method. The other part of the insulating layer 113 which is coated by the resist film is not removed. A metal layer having a uniform thickness is formed in the openings by a sputtering method or by an electron beam evaporation method to form the n-side bus electrode layer 110 and the p-side bus electrode layer 114. Finally, the resist film is removed by immersing the GaAs substrate in a detachment liquid. In this way, the insulating layer 113 shown in FIG. 2C is formed.

Figure 2D:
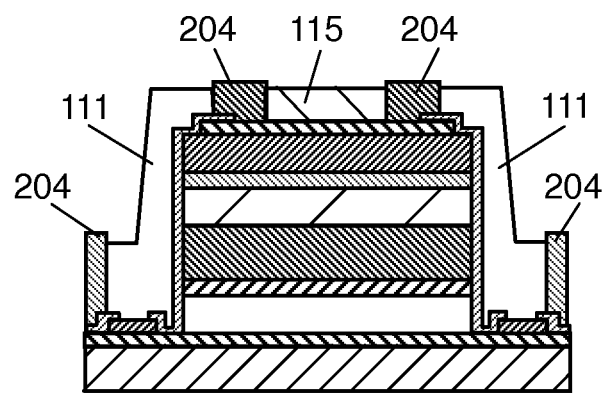
FIG. 2D shows a cross-sectional view of the fabrication method of the solar cell according to the embodiment subsequent to FIG. 2C.

As shown in FIG. 2D, a second mask 204 is formed by photolithography. Subsequently, the n-side connecting part 111 and the p-side connecting part 115 are formed by a sputtering method or by an electron beam deposition method.

Figure 2E:
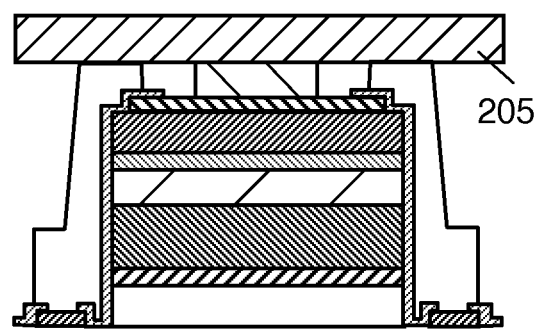
FIG. 2E shows a cross-sectional view of the fabrication method of the solar cell according to the embodiment subsequent to FIG. 2D.

As shown in FIG. 2E, the upper surface of the p-side connecting part 115 is brought into contact with a supporting substrate 205, and the p-side connecting part 115 is fixed to the supporting substrate 205. Subsequently, the GaAs substrate 201 and the sacrifice layer 202 are removed by dry etching or by wet etching.

It is preferable that the supporting substrate 205 has the same size as the GaAs substrate 201. An example of the supporting substrate 205 is a silicon substrate or a glass substrate. A wax or an adhesion sheet may be interposed between the supporting substrate 205 and the p-side connecting part 115, when needed.

The sacrifice layer 202 is etched selectively to remove the GaAs substrate 201.

The GaAs substrate 201 can be etched with a mixture of citric acid and hydrogen peroxide water. The sacrifice layer 202 consisting of AlAs or InGaP may be etched with hydrofluoric acid.

Figure 2F:
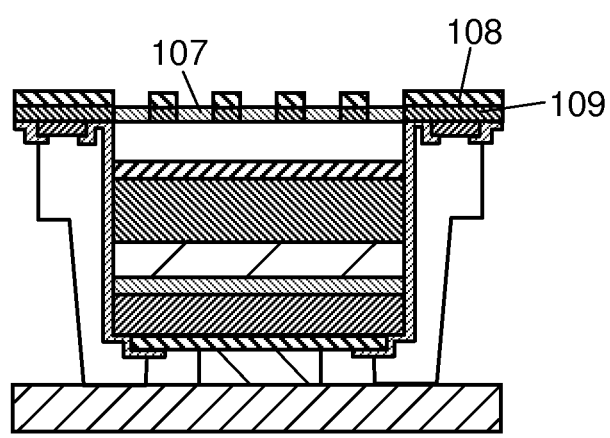
FIG. 2F shows a cross-sectional view of the fabrication method of the solar cell according to the embodiment subsequent to FIG. 2E.

As shown in FIG. 2F, the n-side electrode layer 109 and the ZnO transparent electrode layer 108 are stacked on the n-side bus electrode layer 110, the n-side contact layer 119, and the insulating layer 113 so as to form the grid electrode 116. More particularly, the grid electrode 116 is formed as below.

First, a mask for the grid electrode 116 is formed on the n-side bus electrode layer 110, the n-side contact layer 119, and the insulating layer 113 by photolithography. Then, the n-side electrode layer 109 and the ZnO transparent electrode layer 108 are formed. Subsequently, the mask for the grid electrode 116 is removed.

The n-side electrode layer 109 consists of $Ag_xAu_{1-x}$. The character "x" represents a value of not less than 0.1 and not more than 0.5. The n-side electrode layer 109 can be formed by a sputter vacuum deposition method. A convex-concave structure can be formed on the surface of the n-side electrode layer 109 by wet etching, when needed.

The ZnO transparent electrode layer 108 can be formed by a chemical bath deposition method (hereinafter, referred to as a "CBD method"). Subsequently, the mask for the grid electrode 116 is removed with a detachment liquid. A convex-concave structure can be formed on the surface of the ZnO transparent electrode layer 108 by a wet etching method, when needed. In this way, the grid electrode 116 comprised of the n-side electrode layer 109 and the ZnO transparent electrode layer 108 is formed.

Then, a mask is formed on the grid electrode 116 by photolithography. The anti-reflection film 107 is formed through this mask by an electron beam vacuum deposition method. Subsequently, the mask is removed with a detachment liquid.

Figure 2G:
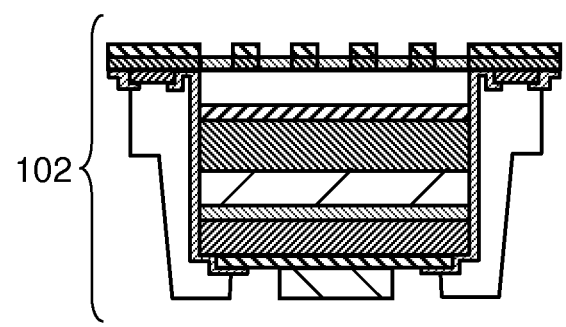
FIG. 2G shows a cross-sectional view of the fabrication method of the solar cell according to the embodiment subsequent to FIG. 2F.

As shown in FIG. 2G, the supporting substrate 205 is removed. In this way, the solar cell 102 is obtained. When the supporting substrate 205 is fixed with the wax, the supporting substrate 205 is removed with acetone and isopropyl alcohol.

Figure 2H:
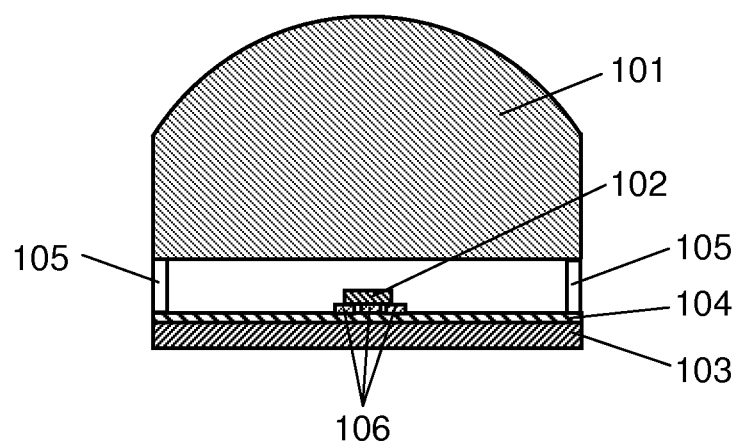
FIG. 2H shows a cross-sectional view of the fabrication method of the solar cell device according to the embodiment subsequent to FIG. 2G.

As shown in FIG. 2H, the insulating layer 104 formed of epoxy resin is formed onto the cooling plate 103. Subsequently, a mask for the electric wiring part 106 is formed by photolithography.

After the electric wiring part 106 was formed by a sputter vacuum deposition method or by an electron beam vacuum deposition method, the mask for the electric wiring part 106 is removed with a detachment liquid.

Silver paste can be interposed between the electric wiring part 106 and the solar cell 102, when needed. The silver paste allows not only the electric wiring part 106 to be connected to the solar cell 102, but also the solar cell 102 to be fixed.

Then, the spacer 105 formed of epoxy resin is formed on the insulating layer 104. The cooling plate 103 comprising the solar cell 102 is attached to the condenser lens 101. In this way, the solar cell device is obtained.

Example 1

In the example 1, the solar cell device shown in FIG. 1A was fabricated in accordance with the method shown in FIG. 2A to FIG. 2H.

The condenser lens 101 was 4 mm square and had a thickness of 2 mm. The condenser lens 101 had a focus spot of 400 um square.

The solar cell device according to the example 1 was fabricated as below.

First, as shown in FIG. 2A, the sacrifice layer 202, the n-type GaAs layer 119, the n-side window layer 120, the n-type emitter layer 121, the p-type base layer 122, the p-side window layer 123, and the p-side contact layer 124 were grown on the non-doped GaAs substrate 201 (4 inches of wafers, thickness: 450 um) in this order by an MOCVD method. Table 1 shows the composition and thickness of each layer in the solar cell according to the example 1.

TABLE 1

|  | Composition | Type | Dopant Concentration [cm$^{-3}$] | Thickness [um] |
|---|---|---|---|---|
| p-side contact layer | GaAs | Zn | $1.0 \times 10^{19}$ | 0.02 |
| p-side window layer | InGaP | Zn | $1.0 \times 10^{19}$ | 0.05 |
| p-type base layer | GaAs | Zn | $1.0 \times 10^{16}$ | 2.5 |
| n-type emitter layer | GaAs | Si | $1.0 \times 10^{18}$ | 0.1 |
| n-side window layer | InGaP | Si | $1.0 \times 10^{18}$ | 0.1 |
| n-type GaAs layer | GaAs | Te | $1.0 \times 10^{19}$ | 0.02 |
| sacrifice layer | AlAs | — | — | 0.1 |
| GaAs substrate | GaAs | — | — | 500 |

Then, as shown in FIG. 2B, a resist film of 500 um square was formed on the p-side contact layer 124 by photolithography. The p-side contact layer 124, the p-side window layer 123, the p-type base layer 122, the n-type emitter layer 121, the n-side window layer 120, and the n-side GaAs layer 119 were removed by an ICP plasma etching method using the resist film as the first mask 203. In the ICP plasma etching method, a mixed gas of $BCl_3$ and $SF_6$ was used. In this way, a pattern of 500 um square was formed.

Then, the first mask 203 was removed with a detachment liquid. Subsequently, a resist film was formed by photolithography on a part of the surface of the sacrifice layer 202 and on a part of the surface of the p-side contact layer 124. A titanium film having a thickness of 50 nm and a gold film having a thickness of 250 nm were stacked in this order by an electron beam vacuum deposition method to form the n-side bus electrode layer 110 having a width of 50 um and the p-side bus electrode layer 114 of 200 um square.

Then, the insulating layer 113 formed of a SiN film having a thickness of 300 nm was formed by a plasma CVD method. Subsequently, a resist film (not shown) having openings on the n-side bus electrode layer 110 and the p-side bus electrode layer 114 was stacked on the insulating layer 113 by photolithography. The insulating layer 113 exposed at the openings was removed by dry etching. Finally, the resist film was removed with a detachment liquid. In this way, a laminate shown in FIG. 2C was obtained.

Then, as shown in FIG. 2D, the second mask 204 was formed on the insulating layer 113 by photolithography. Subsequently, a titanium film having a thickness of 50 nm and a gold film having a thickness of 250 nm were stacked in this order by an electron beam vacuum deposition method to form the n-side connecting part 111 and the p-side connecting part 115.

As shown in FIG. 2E, the second mask 204 was removed with a detachment liquid. Wax was applied to the surface of the p-side connecting part 115 with a spin coater. Subsequently, the wax was dried. Then, as shown in FIG. 2E, the p-side connecting part 115 was fixed to the supporting substrate 205 made of glass.

The GaAs substrate 201 was removed with a mixture of citric acid and hydrogen peroxided water. Subsequently, the sacrifice layer 202 formed of AlAs was removed with a buffered hydrofluoric acid liquid.

Figure 3:
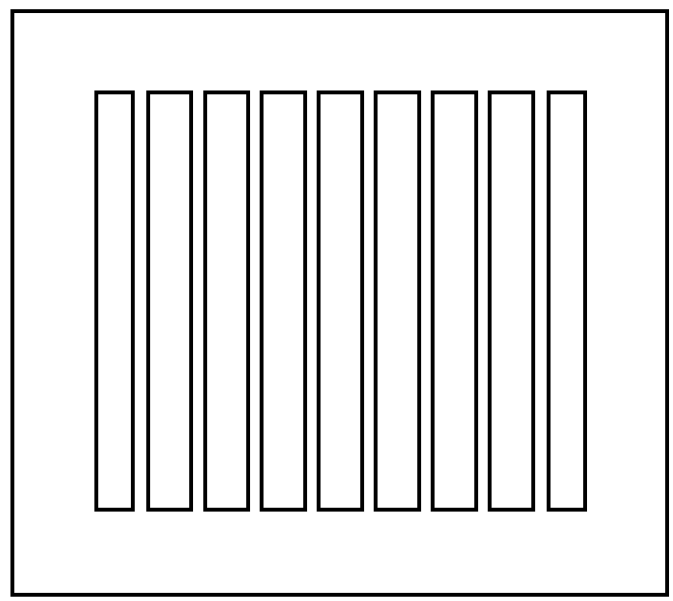
FIG. 3 shows a top view of a grid electrode according to the embodiment.

The mask for the grid electrode 116 shown in FIG. 3 was formed on the surface of the laminate by photolithography. The n-side electrode layer 109 formed of an $Ag_{0.1}Au_{0.9}$ layer having a thickness of 300 nm was stacked by a sputtering method through the mask, using a target having an Ag:Au molar ratio of 9:1.

The outer side length and the inner side length of the mask were 700 um and 500 um, respectively. As shown in FIG. 3, the mask had eight belts. Each belt had a width of 10 um.

Then, the ZnO transparent electrode layer 108 having a thickness of 1 um was formed on the n-side electrode layer 109 by a CBD method. More particularly, the GaAs substrate 201 was immersed in a mixture of 0.1M $Zn(NO_3)_2$ and 0.1M hexamethylene tetramine at 70 degrees Celsius for three hours to form the ZnO transparent electrode layer 108. Then, the mask was removed with a detachment liquid. In this way, the grid electrode 116 comprised of the n-side electrode layer 109 and the ZnO transparent electrode layer 108 was formed. As shown in FIG. 2F, the grid electrode 116 was formed on a part of the upper surface of the n-type GaAs layer 119.

Then, a mask was formed on the grid electrode 116 by photolithography. A $MgF_2$ layer having a thickness of 140 nm was formed on the n-side contact layer 119 using an electron beam vacuum deposition method. The mask was removed with a detachment liquid. In this way, the anti-reflection film 107 was formed. As shown in FIG. 2F, the anti-reflection film 107 was formed on the other part of the upper surface of the n-side GaAs layer 119. As shown in FIG. 2G, wax was dissolved with isopropanol to remove the p-side connecting part 115 from the supporting substrate 205. In this way, the solar cell 102 was obtained.

Then, epoxy resin was applied on the cooling plate 103 formed of an aluminum sheet of 4 mm square to form the insulating layer 104 having a thickness of 100 um. A resist film was stacked by photolithography to form a mask for the electric wiring part 106. A copper film having a thickness of 40 um was formed by a sputtering method. Then, the mask was removed with a detachment liquid. In this way, the electric wiring part 106 was formed.

As shown in FIG. 2H, the solar cell 102 was fixed on the electric wiring part 106 with silver paste. The n-side connecting part 111 and the p-side connecting part 115 were connected to the electric wiring part 106 electrically.

Then, epoxy resin was applied on the cooling plate 103 to form the spacer 105. The condenser lens 101 was fixed on the spacer 105 in such a manner that the center of the focus spot of the condenser lens 101 corresponds with the center of the solar cell 102. The distance between the condenser lens 101 and the solar cell 102 was 1 mm. In this way, the solar cell device according to the example 1 was obtained.

Using a solar simulator (AM1.5G), the conversion efficiency of the solar cell device thus obtained was measured. The measured conversion efficiency was 23.2%.

Furthermore, the solar cell device was subjected to an irradiation test for 500 hours. After the irradiation test, the grid electrode 116 was not peeled off from the n-side contact layer 119.

After the n-side electrode layer 109 was formed, the solar cell 102 was subjected to a peel-off test using an adhesion intensity measurement machine (available from QUAD Group company, trade name: Romulus When a test flake was not peeled off in the pull-off method of 10 Mpa, "No peel off" was determined. As a result, the n-side electrode layer 109 was not peeled off from the n-type GaAs layer 119.

Furthermore, R1 and R2 were measured after the ZnO transparent electrode layer 108 was formed. As a result, the value of R2/R1 was 1.5.

Meanwhile, the grid electrode 116 was formed on a glass substrate. The diffused transmission light of the grid electrode 116 was measured using an integrating sphere. The value of the diffused light/the incident light was 82%.

The ratio of the diffused light/the incident light was measured with a turbidimeter (available from Nippon Denshoku Industries Co. Ltd., trade name: NDH2000). The grid electrode 116 formed on the glass substrate was fixed to the center of the integrating sphere, and the intensity of the diffused transmission light was measured. Then, measured was the intensity of the incident light generated when the surface of the sample (the grid electrode 116) was irradiated with the light from a C light source. The ratio of the diffused light/the incident light was calculated on the basis of the diffused transmission light.

Table 2 shows results of the examples 1 to 2 and the comparative examples 1 to 5.

Example 2

The solar cell 102 was fabricated as in the example 1, except that the n-side electrode layer 109 consisting of $Ag_{0.5}Au_{0.5}$ was formed using a target having an Au:Ag molar ratio of 1:1.

The obtained solar cell 102 was subjected to the tests similar to those of the example 1.

The conversion efficiency was a high value of 22.8%.

Comparative Example 1

Figure 4:
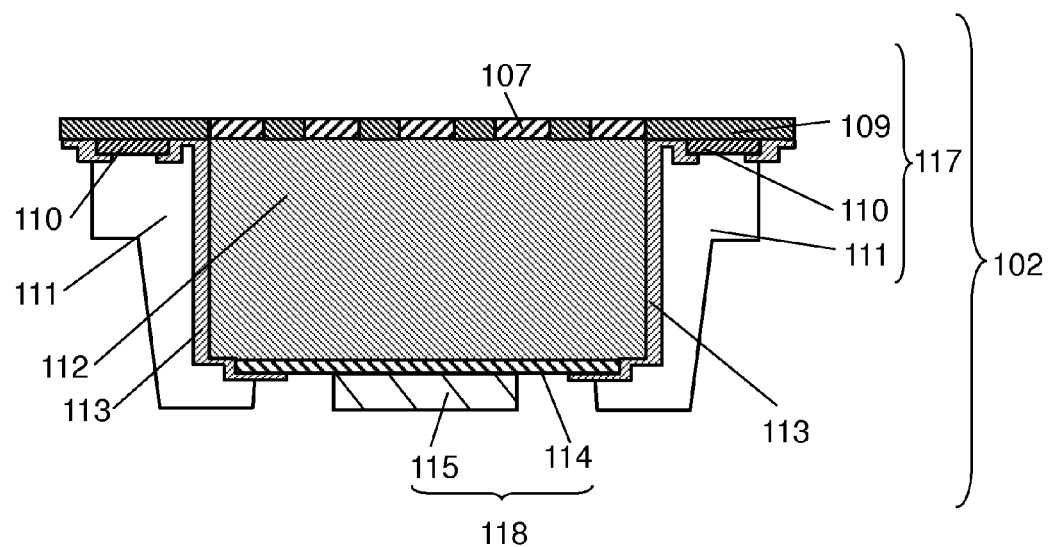
FIG. 4 shows a cross-sectional view of the solar cell according to the comparative example 1.
Figure 5:
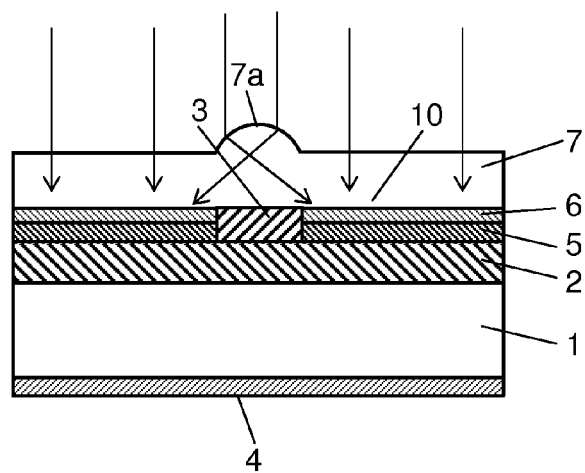
FIG. 5 shows a cross-sectional view of the solar cell disclosed in Patent Literature 1.

As shown in FIG. 4, the solar cell 102 was fabricated as in the example 2, except that the ZnO transparent electrode layer 108 was not formed.

The obtained solar cell 102 was subjected to the tests similar to those of the example 1.

The conversion efficiency was a low value of 18.2%.

Comparative Example 2

The solar cell 102 was fabricated as in the example 1, except that the n-side electrode layer 109 consisting of Au was formed using a target consisting only of Au. Needless to say, this n-side electrode layer 109 contained no silver. After the CBD method was performed, no ZnO particles were deposited on the n-side electrode layer 109.

The obtained solar cell 102 was subjected to the tests similar to those of the example 1.

The conversion efficiency was a low value of 19.8%.

Comparative Example 3

The solar cell 102 was fabricated as in the example 1, except that the n-side electrode layer 109 consisting of $Ag_{0.8}Au_{0.2}$ was formed using a target having an Au:Ag molar ratio of 4:1.

The obtained solar cell 102 was subjected to the tests similar to those of the example 1.

The conversion efficiency was a low value of 20.6%.

Comparative Example 4

The solar cell 102 was fabricated as in the example 1, except that the ZnO transparent electrode layer 108 was formed by a pulsed laser deposition method (hereinafter, referred to as a "PLD method"). In the comparative example 4, no columnar particles were formed, but spherical ZnO particles were formed.

The obtained solar cell 102 was subjected to the tests similar to those of the example 1.

The conversion efficiency was a low value of 20.2%.

Comparative Example 5

The solar cell 102 was fabricated as in the example 2, except that the ZnO transparent electrode layer 108 was formed by immersing the laminate in a mixture of 10 mM $Zn(NO_3)_2$ and 10 mM hexamethylene tetramine at a temperature of 70 degrees Celsius for three hours. Note that the concentration of the mixture is much greater than that of the example 2 (100 times).

The ratio of R2/R1 of the solar cell 102 according to the comparative example 5 was 1.0.

The conversion efficiency was a low value of 20.9%.

Comparative Example 6

The solar cell 102 was fabricated as in the example 2, except that the ZnO transparent electrode layer 108 was formed by immersing the laminate in a mixture of 1 mM $Zn(NO_3)_2$ and 1 mM hexamethylene tetramine at a temperature of 70 degrees Celsius for three hours. Note that the concentration of the mixture is much greater than that of the example 2 (10 times).

The ratio of R2/R1 of the solar cell 102 according to the comparative example 6 was 1.0.

The conversion efficiency was a low value of 19.3%.

TABLE 2

|  | Composition | Ratio of the diffused light/the incident light [%] | Diameter ratio R2/R1 | Crystal structure of the ZnO particle | Electrode peel-off | Conversion efficiency [%] |
| --- | --- | --- | --- | --- | --- | --- |
| Example 1 | Ag0.1Au0.9 | 82 | 1.5 | Columnar | No | 23.2 |
| Example 2 | Ag0.5Au0.5 | 20 | 1.1 | Columnar | No | 22.8 |
| Comparative example 1 | Ag0.5Au0.5 | — | — | — | No | 18.2 |

TABLE 2-continued

|  | Composition | Ratio of the diffused light/the incident light [%] | Diameter ratio R2/R1 | Crystal structure of the ZnO particle | Electrode peel-off | Conversion efficiency [%] |
|---|---|---|---|---|---|---|
| Comparative example 2 | Au | — | — | ZnO single crystal was not formed. | No | 19.8 |
| Comparative example 3 | Ag0.8Au0.2 | 62 | 1.2 | Columnar | No | 20.6 |
| Comparative example 4 | Ag0.5Au0.5 | 2 | — | Spherical | No | 20.2 |
| Comparative example 5 | Ag0.5Au0.5 | 15 | 1.0 | Columnar | No | 20.9 |
| Comparative example 6 | Ag0.5Au0.5 | 76 | 1.8 | Columnar | No | 19.3 |

As is clear from Table 2, a solar cell having high conversion efficiency is provided when both of the following requirements (1) and (2) are satisfied.

Requirement (1): the n-side electrode layer 109 is $Ag_xAu_{1-x}$ (x represents a value of not less than 0.1 and not more than 0.5), and Requirement (2): the ratio of R2/R1 is not less than 1.1 and not more than 1.5.

INDUSTRIAL APPLICABILITY

The present invention provides a new solar cell having high conversion efficiency and a method for fabricating the same.

REFERENCE SIGNS LIST

101 condenser lens
102 solar cell
103 cooling plate
104 insulating layer
105 spacer
106 electric wiring part
107 anti-reflection film
108 ZnO transparent electrode layer
109 n-side electrode layer
110 n-side bus electrode layer
111 n-side connecting part
112 power generation layer
113 insulating layer
114 p-side bus electrode layer
115 p-side connecting part
116 grid electrode
117 obverse electrode
118 reverse electrode
119 n-side contact layer
120 n-side window layer
121 n-type emitter layer
122 p-type base layer
123 p-side window layer
124 p-side contact layer
201 GaAs substrate
202 sacrifice layer
203 first mask
204 second mask
205 supporting substrate

The invention claimed is:

1. A solar cell comprising:
an n-type semiconductor layer;
a p-type semiconductor layer;
a p-side electrode layer;
an n-side electrode; and
a ZnO transparent electrode layer; wherein
the n-type semiconductor layer is in contact with the p-type semiconductor layer;
the p-type semiconductor layer is interposed between the p-side electrode layer and the n-type semiconductor layer;
the n-type semiconductor layer is interposed between the n-side electrode layer and the p-type semiconductor layer;
the n-side electrode layer covers a part of the upper surface of the n-type semiconductor layer;
the n-side electrode layer formed of $Ag_xAu_{1-x}$;
x represents a value of not less than 0.1 and not more than 0.5;
the ZnO transparent electrode layer is formed on the upper surface of the n-side electrode layer;
the ZnO transparent electrode layer is composed of a plurality of ZnO columnar particles,
each ZnO columnar particle has a longitudinal direction substantially parallel to a normal line of the ZnO transparent electrode layer; and
the cross-sectional area of each ZnO columnar particles that appears by cutting the ZnO columnar particles perpendicularly to the longitudinal direction increases from the upper surface of the n-side electrode layer to the upper surface of the ZnO transparent electrode layer.

2. The solar cell according to claim 1, wherein
a ratio of S2/S1 is not less than 1.21 and not more than 2.25;
S1 is a cross-sectional area at the bottom end of the ZnO columnar particle which is in contact with the upper surface of the n-side electrode layer; and
S2 is a cross-sectional area at the upper end of the ZnO columnar particle located at the upper surface of the ZnO transparent electrode layer.

3. The solar cell according to claim 1 further comprising an anti-reflection film,
the anti-reflection film covers the other part of the upper surface of the n-type semiconductor layer.

4. A method for generating an electric power using a solar cell, the method comprising steps of:
   a step (A) of preparing the solar cell comprising:
   an n-type semiconductor layer;
   a p-type semiconductor layer;
   a p-side electrode layer;
   an n-side electrode; and
   a ZnO transparent electrode layer; wherein
   the n-type semiconductor layer is in contact with the p-type semiconductor layer;
   the p-type semiconductor layer is interposed between the p-side electrode layer and the n-type semiconductor layer;
   the n-type semiconductor layer is interposed between the n-side electrode layer and the p-type semiconductor layer;
   the n-side electrode layer covers a part of the upper surface of the n-type semiconductor layer;
   the n-side electrode layer formed of $Ag_xAu_{1-x}$;
   x represents a value of not less than 0.1 and not more than 0.5;
   the ZnO transparent electrode layer is formed on the upper surface of the n-side electrode layer;
   the ZnO transparent electrode layer is composed of a plurality of ZnO columnar particles,
   each ZnO columnar particle has a longitudinal direction substantially parallel to a normal line of the ZnO transparent electrode layer; and
   the cross-sectional area of each ZnO columnar particles that appears by cutting the ZnO columnar particles perpendicularly to the longitudinal direction increases from the upper surface of the n-side electrode layer to the upper surface of the ZnO transparent electrode layer, and
   a step (B) of irradiating the n-type semiconductor layer and the p-type semiconductor layer with sunlight through the ZnO transparent electrode layer so as to generate a voltage difference between the p-side electrode layer and the n-side electrode layer.

5. A method for fabricating a solar cell, the method comprising steps of:
   a step (a) of preparing a electric power generation element comprising an n-type semiconductor layer, a p-type semiconductor layer, and a p-side electrode layer; wherein
   the n-type semiconductor layer is in contact with the p-type semiconductor layer; and
   the p-type semiconductor layer is interposed between the p-side electrode layer and the n-type semiconductor layer;
   a step (b) of forming an n-side electrode layer consisting of $Ag_xAu_{1-x}$ on an upper surface of the n-type semiconductor layer; wherein
   x represents a value of not less than 0.1 and not more than 0.5; and
   the n-side electrode layer covers a part of the upper surface of the n-type semiconductor layer; and
   a step (c) of forming a ZnO transparent electrode layer on an upper surface of the n-side electrode layer by a chemical bath deposition method; wherein
   the ZnO transparent electrode layer is composed of a plurality of ZnO columnar particles;
   each ZnO columnar particle has a longitudinal direction substantially parallel to a normal line of the ZnO transparent electrode layer; and
   the cross-sectional area of each ZnO columnar particles that appears by cutting the ZnO columnar particles perpendicularly to the longitudinal direction increases from the upper surface of the n-side electrode layer to the upper surface of the ZnO transparent electrode layer.

6. The method according to claim 5, wherein
a ratio of S2/S1 is not less than 1.21 and not more than 2.25; wherein
S1 is a cross-sectional area at the bottom end of the ZnO columnar particle which is in contact with the upper surface of the n-side electrode layer; and
S2 is a cross-sectional area at the upper end of the ZnO columnar particle located at the upper surface of the ZnO transparent electrode layer.

7. The method according to claim 5, wherein
in the step (c), the upper surface of the n-side electrode layer is brought into contact with a mixture of 0.1M Zn$(NO_3)_2$ and 0.1M hexamethylene tetramine.

8. The method according to claim 5 further comprising:
a step (d) of forming an anti-reflection layer on the other part of the upper surface of the n-type semiconductor layer after the step (c).

* * * * *